United States Patent [19]
Rapeli

[11] Patent Number: 5,822,366
[45] Date of Patent: Oct. 13, 1998

[54] TRANSCEIVER AND METHOD FOR GENERATING AND PROCESSING COMPLEX I/Q-SIGNALS

[75] Inventor: Juha Rapeli, Oulu, Finland

[73] Assignee: Nokia Mobile Phones Ltd., Salo, Finland

[21] Appl. No.: 634,509

[22] Filed: Apr. 18, 1996

[30] Foreign Application Priority Data

Apr. 21, 1995 [FI] Finland .................................. 951918

[51] Int. Cl.⁶ .................................................. H04B 1/38
[52] U.S. Cl. .......................... 375/219; 375/219; 375/325; 375/326; 375/327; 375/328; 375/344; 329/308; 331/12; 455/74; 455/76; 455/260; 455/264; 455/314; 455/324
[58] Field of Search ..................................... 375/219, 261, 375/271, 285, 298, 302, 322, 324, 328, 344; 332/103, 104, 144; 329/304, 306–308, 321; 331/12; 455/74–76, 84–86, 89, 205, 207, 209, 260, 264, 313, 314–316, 318, 324

[56] References Cited

U.S. PATENT DOCUMENTS

| | | | |
|---|---|---|---|
| 4,955,039 | 9/1990 | Rother et al. ............................. | 375/316 |
| 5,079,520 | 1/1992 | Rapeli ................................. | 331/100 A |
| 5,249,204 | 9/1993 | Funderburk et al. .................... | 375/326 |
| 5,291,474 | 3/1994 | Ikonen et al. ............................. | 370/30 |
| 5,301,367 | 4/1994 | Heinonen ................................. | 455/76 |
| 5,325,075 | 6/1994 | Rapeli ..................................... | 332/103 |
| 5,390,168 | 2/1995 | Vimpari ..................................... | 370/30 |
| 5,471,652 | 11/1995 | Hulkko ..................................... | 455/76 |
| 5,511,235 | 4/1996 | Duong et al. ............................. | 455/75 |

FOREIGN PATENT DOCUMENTS

| | | |
|---|---|---|
| 0305603 A1 | 3/1989 | European Pat. Off. . |
| 0541305 A1 | 5/1993 | European Pat. Off. . |
| 0581573 A1 | 2/1994 | European Pat. Off. . |
| 892081 | 11/1989 | Finland . |
| WO 94/14247 | 6/1994 | WIPO . |

Primary Examiner—Stephen Chin
Assistant Examiner—Amanda T. Le
Attorney, Agent, or Firm—Perman & Green, LLP

[57] ABSTRACT

The invention relates to a transceiver for generating complex I/Q-signals on a transmission frequency ($f_{TX}$) and for receiving them on a reception frequency ($f_{RX}$). The device comprises a first frequency synthesizer (41) for forming a first mixer signal ($f_{LI}$) for the mixer (42) of the first branch that mixes the I-component of the received signal into a lower-frequency I-signal, and a second frequency synthesizer (411, 49, 46) for forming a second mixer signal ($f_{LQ}$) for the mixer (421) of the second branch that mixes the Q-component of the received signal into a lower-frequency Q-signal. The device further comprises control means (45) first for directing the phase of the first ($f_{LI}$) and the second ($f_{LQ}$) mixer signals into the same phase in the mixing effects thereof and, thereafter, into a 90 degree mutual phase shift in the mixing effects thereof when receiving signals for bringing the lower-frequency I- and Q-signals into a 90 degree mutual phase shift.

15 Claims, 8 Drawing Sheets

TRANSCEIVER AND METHOD FOR GENERATING AND PROCESSING COMPLEX I/Q-SIGNALS

BACKGROUND OF THE INVENTION

The invention relates to a method and a transceiver for generating a complex I/Q-signal at a transmission frequency and for receiving the same at a reception frequency.

The object of the invention is a transceiver based on the I/Q architecture. I/Q-transceivers are generally used in digital radio-frequency data transmission which is based on phase modulation. Generally, this kind of a receiver is also linear, meaning that the amplitude of the output signal obtained from the receiver is linearly proportional to the amplitude of an input signal.

Figure 1:
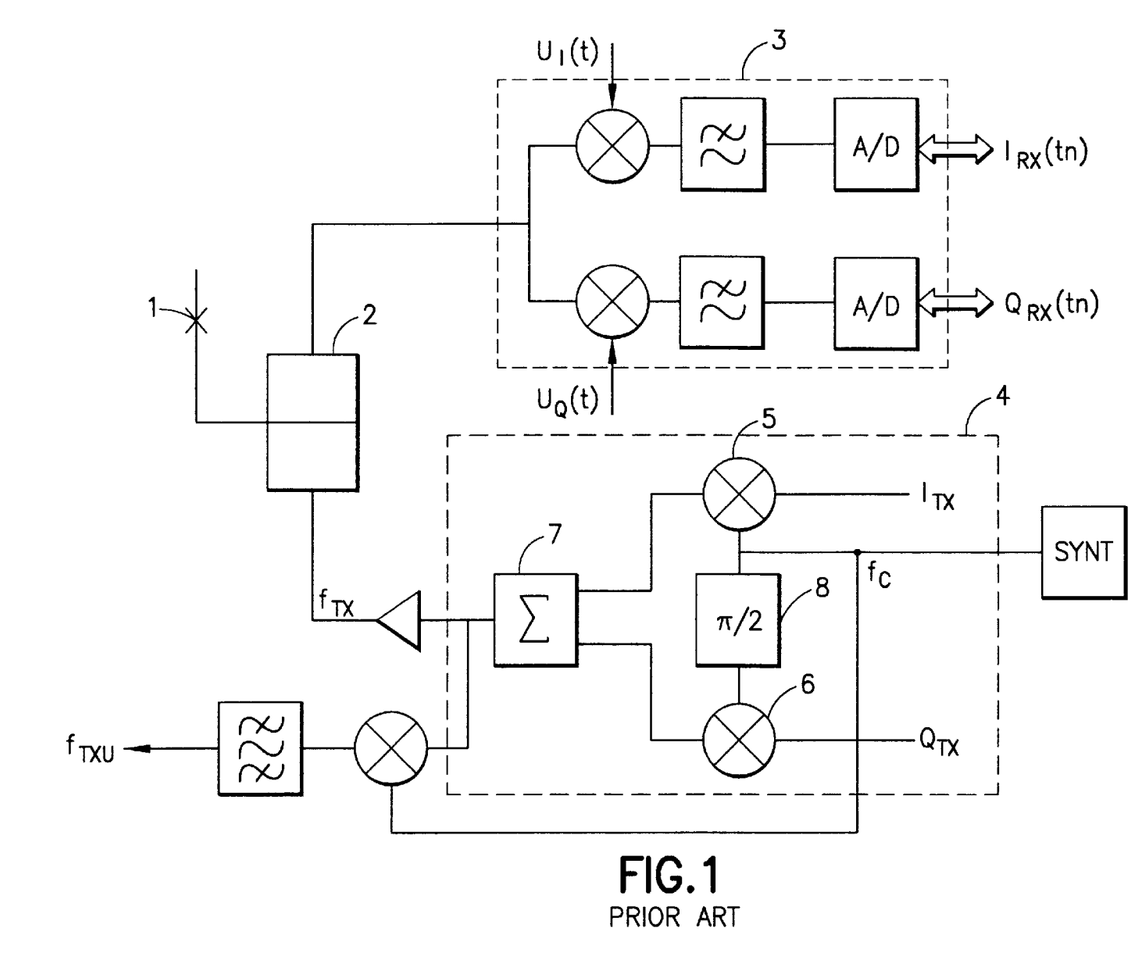
FIG. 1 presents the structure of a known prior art transceiver with respect to the modulation.

FIG. 1 shows a known radio-frequency transceiver in which the reception is based on direct conversion. For reception, received signals coming from antenna 1 are brought, via deplexer 2 separating the transmission and reception signals, to receiver 3, of which only the parts essential to the description of the principle of the invention are presented in FIG. 1. The signal received by direct conversion is expressed in the form of zero-frequency I- and Q-vectors of the carrier wave, and is further A/D-converted into digital sampled data $I_{RX}(t_n)$ and $Q_{RX}(t_n)$.

Figure 2:
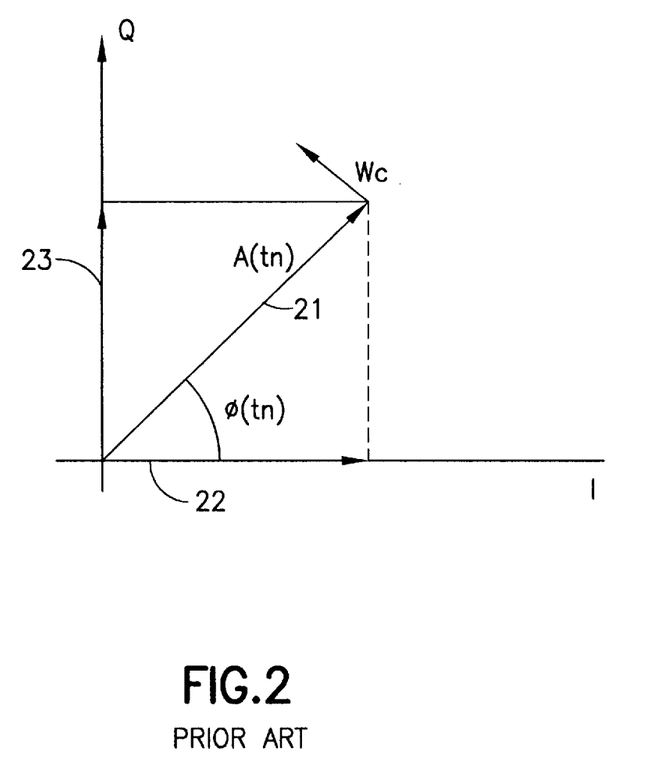
FIG. 2 presents the vector presentation of the I- and Q-signals.

Let us say the received signal is:

$$U_{RX}(t) = A(t) \cdot \cos\{\omega_c t + \phi(t)\} \quad (1)$$

where $A(t)$ is the signal amplitude as a function of time, $\omega_c$ is the angular frequency of the carrier wave, and $\phi(t)$ is the phase of the carrier wave and, especially in the case of phase modulation, the $\phi(t)$ that varies as a function of time represents the modulation. The value of the equation (1) at moment $t_n$ in time is presented as vector 21 in FIG. 2. The reception takes place so that two carriewave frequency $\omega_c$ signals $U_I(t)$ and $U_Q(t)$ are formed in the receiver, the one of them, i.e., the I-component, being in the same phase with the unmodulated carrier wave, i.e.:

$$U_I(t) = \cos(\omega_c t) \quad (2)$$

and the Q-component, i.e. the phase quadrature component, which is phase-shifted by 90 degrees with the above, is:

$$U_Q(t) = \sin(\omega_c t). \quad (3)$$

By multiplying $U_{RX}(t)$ by these local signals $U_I(t)$ and $U_Q(t)$ and by lowpass filtering the obtained results, the following equations are obtained as output signals of the I- and Q-branches at moment $t_n$ in time:

$$I(t_n) = A(t_n) \cdot \cos\phi(t_n)$$

$$Q(t_n) = A(t_n) \cdot \sin\phi(t_n) \quad (4)$$

illustrated by the I-component 22 and Q-component 23 in the vector presentation of FIG. 2. Correspondingly, the modulation for the transmission takes place in modulator 4 shown in FIG. 1 so that, in multipliers 5 and 6, the unmodulated I- and Q-components of desired carrierwave frequency $\omega_c$ are multiplied by modulations $I_{TX}(t)$ and $Q_{TX}(t)$ and summed in adder 7 into a desired modulated transmission signal. The requirement of accuracy for the phase difference between the I- and Q-components is in the order of a few degrees. The implementation of the I/Q-transceiver is made rather difficult because of the fact that on the circuit board (in the circuit board material) of the transceiver the wavelength of a 1 GHz frequency signal is about 10 cm, whereby a phase shift of tens of degrees occurs in the conductors between the different parts of the transceiver. Furthermore, a phase shift of tens of degrees to the 1 GHz frequency signal easily occurs in the amplifier stages, which phase shift often depends on the temperature, and varies from unit to unit and is therefore difficult to manage. To a 2 GHz frequency the wavelength on the circuit board is only 5 cm and the phase shift in the amplifiers is larger than on the 1 GHz frequency. Therefore, the wiring of the I- and Q-signals or local frequencies $U_I$ and $U_Q$ from a synthesizer to the multipliers, maintaining the 90° phase shift, is problematic.

The implementation of the above-described, known solutions on discrete components, or on integrated circuits, requires good linearity of the multipliers and prevention of leaking through of input signals, i.e., good isolation, good control of the phase shift of the multipliers and input signals in order to implement the 90° phase shift to an accuracy of a few degrees, as well as implementation of the 90° phase shift in such a way that it is not dependent on the frequency.

Figure 3A:
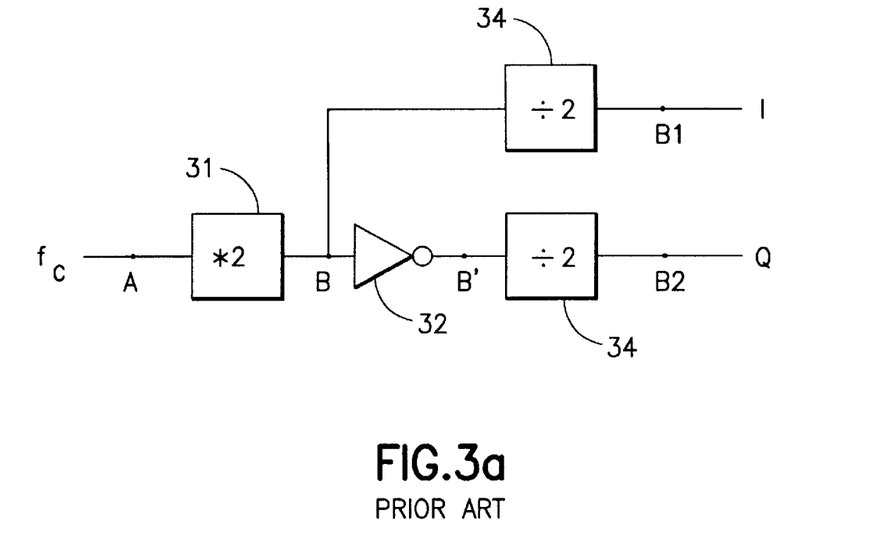
FIG. 3a presents a known prior art solution for implementing the 90° phase shift.
Figure 3B:
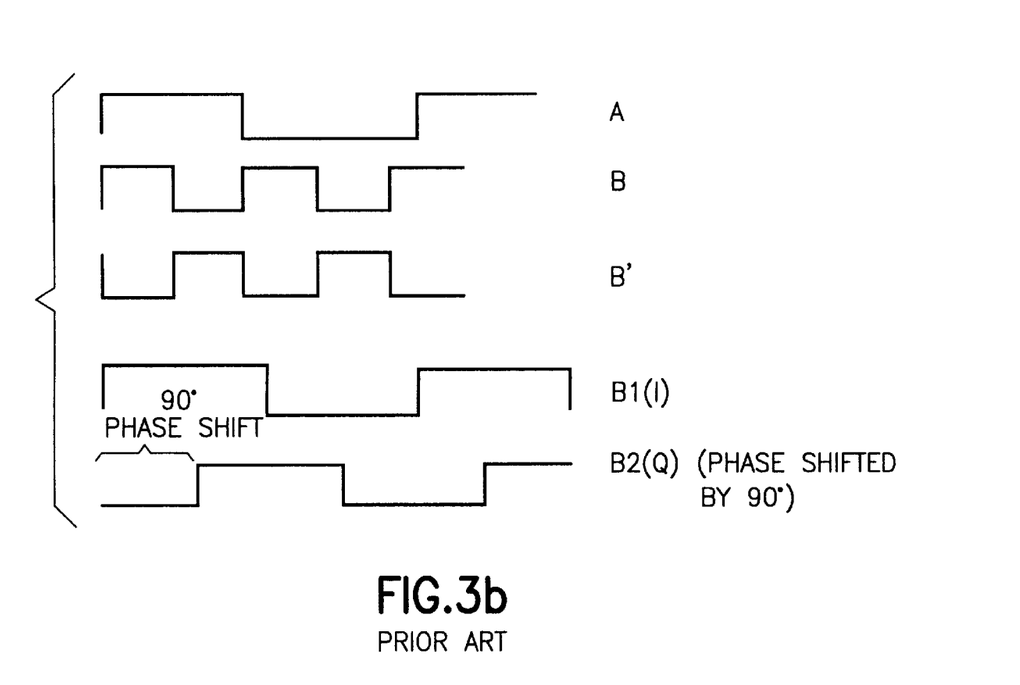
FIG. 3b presents the stages and phases of signals in different points of the block diagram shown in FIG. 3a, FIG. 4 presents the transceiver according to the invention in one of its operating modes.

A known method/device for implementing the 90° phase shift not dependent on the frequency is shown in FIG. 3a, where the input frequency is doubled in a frequency doubler 31, the Q-branch is inverted in an inverting amplifier, such as logic inverter 32, corresponding to a 180° phase shift, and finally, the I- and Q-signals are divided by two in dividers 33 and 34. If the total delays of the I- and Q-branches from point A to points B1 and B2 are equal and the phase shift caused by amplifier 32 is 180°, output signals $U_I$ and $U_Q$ are in a 90° degree phase shift to one another. This is illustrated in FIG. 3b in which the signals are shown in different points A, B, B', B1, B2 in the circuit of FIG. 3a. The circuit of FIG. 3a is functional and can be integrated, but the structures are partially redundant, they consume power and require operation on a double frequency with respect to the RF-frequency of the equipment. Consequently, in radio sets of 1 GHz, for example, the operating frequency of the dividers is 2 GHz and, correspondingly, in devices operating on frequencies of 2 GHz, the circuit would operate on a 4 GHz frequency, causing problems with the silicon in integrated circuits (where such high operating frequencies are difficult to achieve).

Both the circuit structures and the physical distances between the different parts of the transceiver cause phase shifts which can only be controlled partly by implementing both the phase shifters and mixers on the same integrated circuit or by matching the functions on different circuits and the conductor lengths between them carefully to each other. Practice in transceivers according to prior art has proven that the phase shift both on circuits and in couplings between them has to be designed experimentally. Furthermore, problems occur because of individual or temperature variations in the circuits and parts.

SUMMARY OF THE INVENTION

The purpose of the present invention is to eliminate the problems mentioned above. In particular, the phase difference between the I- and Q-branches on the mixing circuits can be controlled accurately by means of the invention, independent of the phase shifts between the frequency synthesizer and the mixers or the variations thereof so that in order to implement the phase shift, neither double operating frequencies nor phase shifters dependent on the frequency are necessary. The invention can be used to eliminate phasing problems of RF-signals generally occurring in I/Q-transceivers, the requirements for accuracy of multipliers used as mixers and modulators are essentially decreased, and the operation of the device is made possible on a wide frequency range and essentially on two different frequency ranges, the other frequencies preferably being about twice as high as the others. The above-mentioned objects are achieved by arranging two frequency synthesizers in the transceiver for providing a first mixer signal to mix the input signal of the receiver (called the I-component in the I-branch) into a lower-frequency I-signal, and for providing a second mixer signal to mix the input signal of the receiver (called the Q-signal in the Q-branch) into a lower-frequency Q-signal. The accurate 90° degree phase difference of the I- and Q-signals is implemented by adjusting the received I- and Q-signals first to the same phase and, thereafter, by controlling the mixer signals into a 90° degree mutual phase shift. In this way, it is ensured that the I- and Q-signals are in the 90° phase shift with respect to one another.

When using two different frequency synthesizers in implementing the 90° degree phase shift, the same frequency synthesizers can be further used to provide two different transmission frequencies. A higher transmission frequency is formed by mixing said first and second mixer signals, one of which has been modulated to form and provide the sum signal thereof as an output. A lower transmission frequency is formed directly from the other mixer signal.

Furthermore, the transceiver according to the invention can be used to receive two different reception frequencies. In this case, before mixing the I- and Q-signals into lower-frequency I-and Q-signals, the higher-frequency reception signal is down-converted by using the first mixer signal into a lower reception frequency while the receiver operates on the higher reception frequency. When the receiver operates on the lower reception frequency, the reception signal is only mixed with a zero-frequency signal, whereby the frequency of the received signal is not altered.

The transceiver according to the invention for generating complex I/Q-signals on a transmission frequency and for receiving the same on a reception frequency, the receiver comprising:

a first branch for processing the I-component of the received signal, a second branch for processing the Q-component of the received signal, the first branch comprises a first mixer for mixing the I-component of the received signal into a lower-frequency I-signal, and the second branch comprises a second mixer for mixing the Q-component of the received signal into a lower-frequency Q-signal, is characterized in that it comprises:

a first frequency synthesizer for forming a first mixer signal for the mixer of the first branch to mix said I-component into said I-signal, and a second frequency synthesizer for forming a second mixer signal for the mixer of the second branch to mix said Q-component into said Q-signal, and control means first for controlling said first and second mixer signals into the same phase with respect to their mixing effects, and thereafter, into a 90 degree mutual phase shift with respect to their mixing effects when receiving signals in order to bring said lower-frequency I- and Q-signals into the 90 degree mutual phase shift.

The method according to the invention for modulating and mixing complex I/Q-signals on a transmission frequency and on a reception frequency, in which the I-signal is processed in the first branch, the Q-signal is processed in the second branch, the I-component of the signal received in the first branch is mixed into a lower-frequency I-signal, and the Q-component of the signal received in the second branch is mixed into a lower-frequency Q-signal, is characterized in that the following stages are carried out in the reception:

a first frequency synthesizer is used to form a first mixer signal which is used to mix the I-component of the received signal into a lower-frequency I-signal, and a second frequency synthesizer is used to form a second mixer signal ($f_{LO}$) which is used to mix the Q-component of the received signal into a lower-frequency Q-signal, and p1 the first and second mixer signals are first controlled into the same phase with respect to their mixing effects, whereby said lower-frequency I-signal and said lower-frequency Q-signal are of the same phase, and thereafter, said mixer signals are controlled into a 90 degree mutual phase shift, whereby said lower-frequency I-signal and said lower-frequency Q-signal are in a 90 degree phase shift with one another.

DETAILED DESCRIPTION

Figure 4:
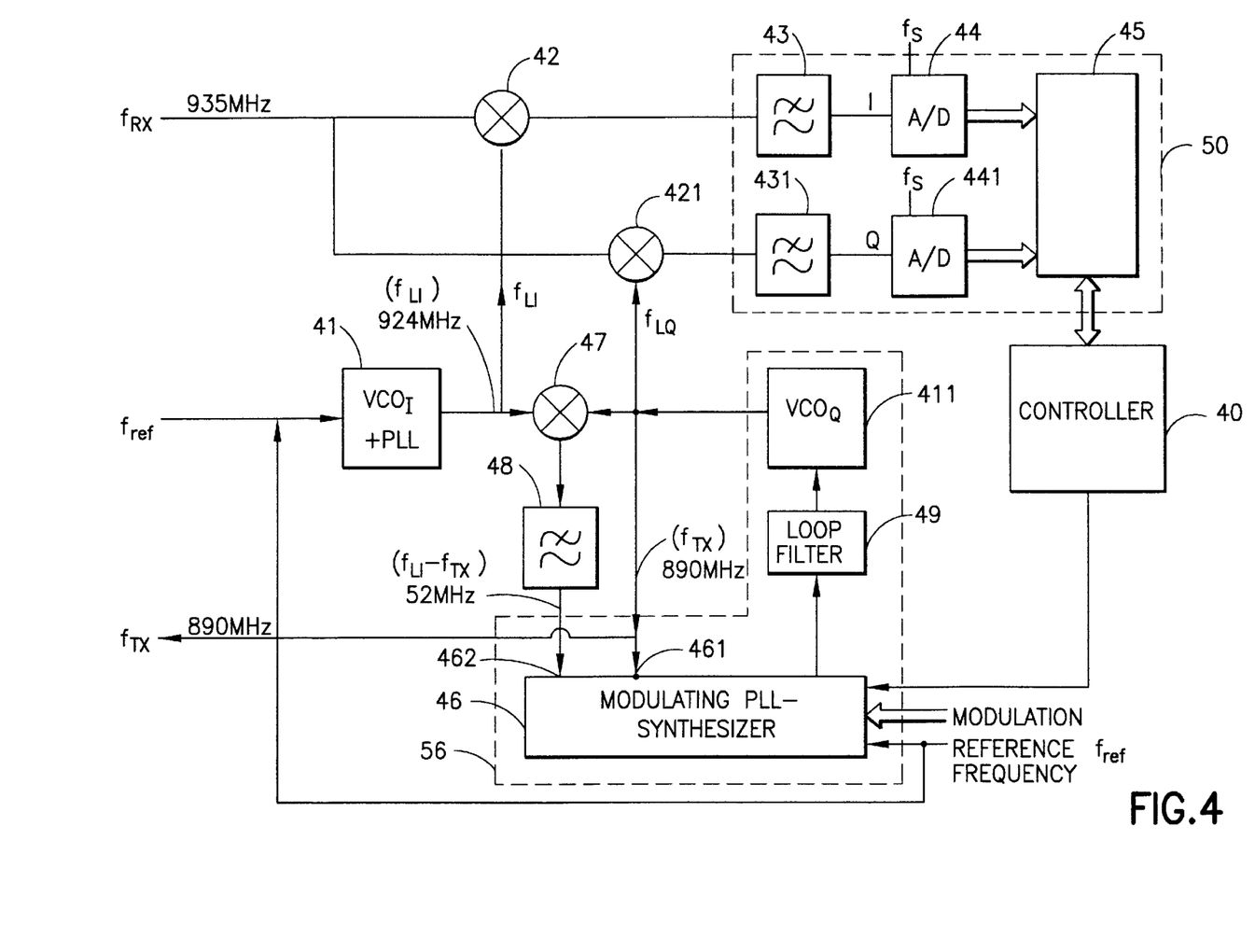

The frequency-generation of the transceiver according to the invention for one transmission and reception frequency range is presented in FIG. 4. It is assumed, for exemplary purposes, that transmission frequency $f_{TX}$ is 890 MHz and reception frequency $f_{RX}$ is 935 MHz (which is the lowest frequency of the reception range in the GSM mobile communication system), and that transmission does not occur simultaneously with reception, i.e., time division multiple access (TDMA) is used, for example, in which the transmission and the reception take place in different time slots. The receiver operates according to the direct conversion principle, i.e., the modulation on an RF frequency is converted directly into base-band frequency I- and Q-vectors. The direct conversion of the received signal is presented in, e.g., publication EP 346 986. The lower-frequency I-component of input signal $f_{RX}$ is obtained by mixing it in mixer 42 with local signal $f_{LI}$ obtained from the output of oscillator 41 operating on reception frequency $f_{RX}$, and by filtering the outputs obtained from mixer 42 by using filter 43 (such as a lowpass filter). Correspondingly, the signal of the Q-branch is mixed in second mixer 421 into a lower frequency, and the desired frequency is filtered from the mixing results in second filter 431 (such as a lowpass filter). Reception signal $f_{RX}$ and unmodulated local frequency $f_{LQ}$, which is approximately of the same frequency with it, are conducted as input signals to mixer 421, the $f_{LQ}$ being of the same frequency as local signal $f_{LI}$ of the I-branch but in a 90 degree phase shift with respect to the same. The I- and Q-signals are further converted into digital words at sampling frequency $f_S$ in A/D-converters 44 and 441 and processed in signal processor 45 whose functions related to the invention are described below.

Local frequency $f_{LQ}$ is generated according to the invention in the reception state so that the output signal of oscillator 411 is led to input 461 of synthesizer circuit 46, the phase difference from the synthesizer circuit being filtered in loop filter 49 into a control signal of voltage-controlled oscillator 411. Loop filter 49 generally comprises an integrator and a lowpass filter for integrating and filtering the phase difference. Input 462 of synthesizer circuit 46 is not operative in this stage. Synthesizer circuit 46 is capable of accurately forming, in addition to the desired frequency, a desired phase and modulation. Solutions related to modulating frequency synthesis and modulation at an offset frequency are described in detail in U.S. Pat. Nos. 5,079,520 and 5,325,075.

Figure 5:
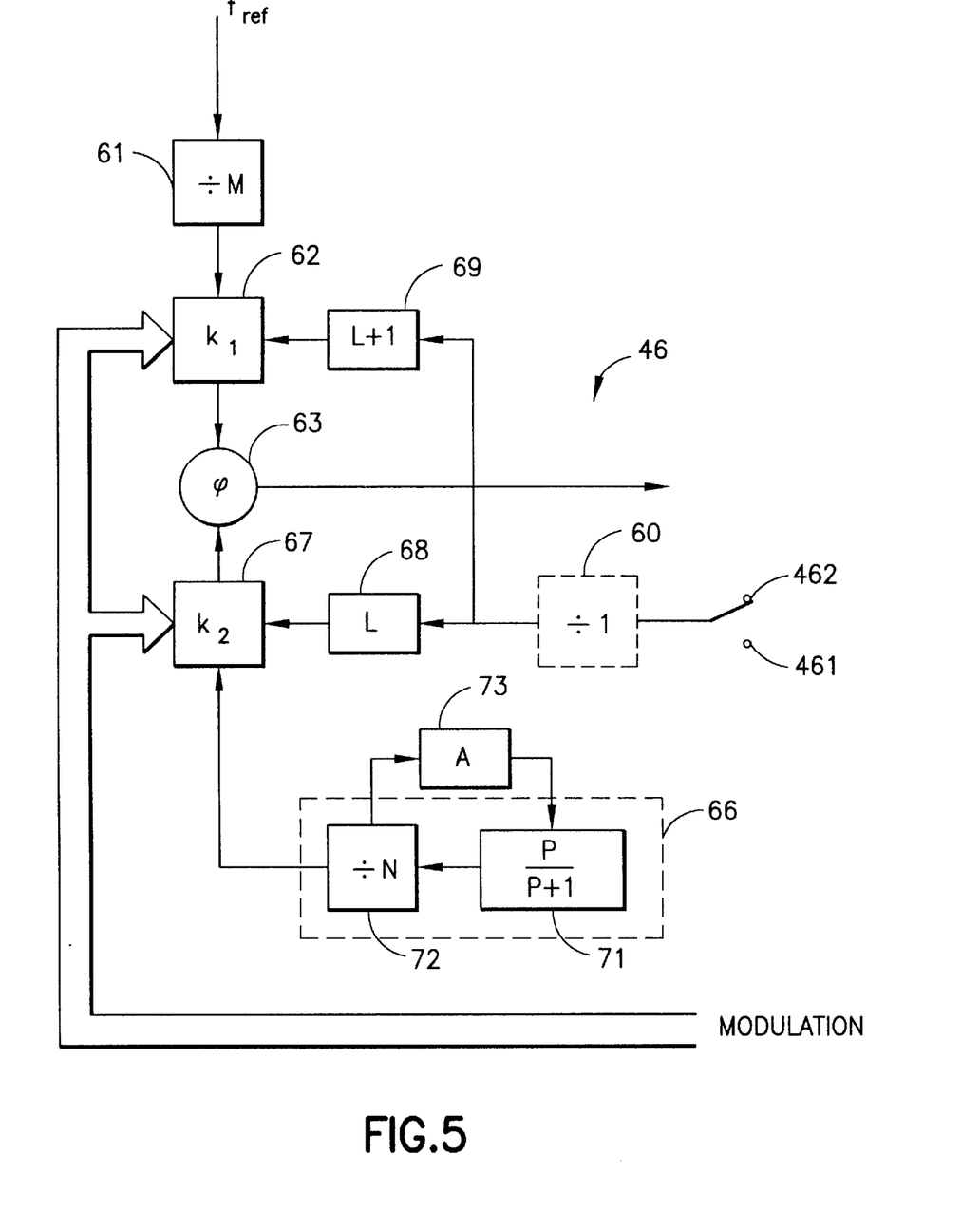
FIG. 5 presents a PLL synthesizer circuit.

The general outline of the internal circuitry of the PLL synthesizer circuit 46 capable of phase modulation are presented in FIG. 5. The method and the circuit are described in more detail in U.S. Pat. No. 5,025,075 (FI 90169). This kind of a synthesizer is characterized in that by continually updating multipliers $k_1$ and $k_2$ of delay elements 62, 67, the phase of the VCO frequency of the synthesizer can be adjusted by any amount of the phase increments $$\Delta\phi = 2\pi \frac{kI}{L(L+1)} \quad (5)$$

where k is an (integer) increment to delay coefficients $k_1$ and $k_2$, I is the dividing number of the delay elements (implemented by divider 50) and L is the number of delay steps for the synthesizer disclosed in the patent in question. Typical numerical values for a 900 MHz synthesizer are, e.g., I=32, L=64, whereby according to equation (5) the $2\pi$ phase circumference is divided into L(L+1)/I, i.e., into 130 parts which is accurate enough to implement the modulation and the 90° degree phase shift at the desired accuracy in GSM mobile communications systems. The other internal parts of the synthesizer, pre-scaler 71, divider 72 of the VCO-branch, modulus controller 73 of the pre-scaler, phase comparator 74 and divider 75 of reference frequency $f_{ref}$ are similar to those in the known PLL frequency synthesizer.

The equation $$f_{LQ} = \frac{f_{ref}}{M} \left\{ NP + A + I\left(\frac{k_2}{L} - \frac{k_1}{L+1}\right) \right\} \quad (6)$$

is valid in the final frequency of the synthesizer in FIG. 5, the values of coefficients P, M, A being given to PLL synthesizer circuit 46 from controller part 40 (FIG. 40).

When using a phase modulating synthesizer, the modulation is applied directly as phase $\phi$ to the Modulation input of PLL synthesizer circuit 46, whereby separate I and Q amplitude modulators with respective RF-adders (e.g., 5, 6, and 7 in FIG. 1) are not needed. The different parts of the synthesizer according to FIG. 5 already operate with preset parameters according to whether the input signal of synthesizer circuit 46 is a radio-frequency signal to input 461 or an offset frequency signal to input 462.

The operation of the transceiver shown in FIG. 4 starts by both oscillators 41 and 411 being started and, by using a known method, being directed to search for a signal on the command channels of the mobile communications system. Once a sufficiently strong signal to be received is located, the phase difference of local frequencies $f_{LQ}$ and $f_{LI}$ is controlled by synthesizer 46 until the signals of the I- and Q-branches are observed by signal processor 45 to be of the same phase. Signal processor 45 receives the I- and Q-signals converted in A/D-converters 44 and 441 and initially sets them in the same phase on the basis of samples I(tn) and Q(tn) obtained from the A/D-converters. The setting of the I- and Q-signals into the same phase can be effected by several known methods, e.g., so that phase difference $\Delta\phi_k$ of local signals $f_{LI}$ and $f_{LQ}$ is modified stepwise and correlation over N samples between the I- and Q-signals is calculated for each phase difference $\Delta\phi_k$ through the sample to formula:

$$c(\Delta\phi_k) = \sum_{i=1}^{N} I(t_i) \times Q(t_i) \quad (7)$$

so that the amount of samples is large enough with respect to the variation of the received signal. The phase difference $\Delta\phi_k$ which provides the highest value for correlation $c(\Delta\phi_k)$, thus corresponds to the I- and Q-signals of the same phase, and the following equation is true between them:

$$I(t_n) = kQ(t_n) \quad (8)$$

Coefficient k thus indicates the relation between the total amplifications of the I- and Q-branches, which can deviate considerably from the ideal value k=1, whereby the phases of the I- and Q-signals are the same. As coefficient k is now known, it can be taken into account in signal processing 45. Thereafter, the mutual phase of oscillators 41 and 411 is modified with the aid of the 90° synthesizer circuit 46 by using, e.g., an advantageous interpolation method which is described in patent publication U.S. Pat. No. 5,079,520, whereby the I- and Q-signals are set in a 90° phase shift. The 90° phase shift is obtained by bringing a control signal to PLL synthesizer circuit 46 from signal processor 45 via controller 40. Thereafter, the receiver operation is initiated in the manner required for each respective mobile communications system. The phase difference set for oscillators 41 and 411 thus remains unaltered henceforth because the synthesizing with synthesizer 46 takes place according to the phase locking principle and oscillators 41, 411 are locked in the same reference frequency.

The above-describe method (in the reception) and the coupling presented in FIG. 4 are preferable because, e.g., there is no need to recognize and, thereby, to measure or compensate during the manufacture or the operation of the receiver, the difference in amplification and the phase shifts between the I- and Q-signal paths of the RF-signals occurring in the oscillators, mixers, or the couplings between them.

When the transmission facility is active the operation of the circuitry according to the invention shown in FIG. 4 is modified so that oscillator 411 is directed by using synthesizer circuit 46 (the control command is provided by signal processor 45 via controller 40) to the desired transmission frequency $f_{TX}$, such as 890 MHz (thus $f_{LQ}=f_{TX}$), and synthesizer 41 to such a frequency $f_{LI}$ (which is of a different size than in the reception) that a suitable transfer frequency $f_S=f_{LI}-f_{TX}$ is obtained via mixer 47 and filter 48 (e.g., a lowpass filter) which is preferably any multiple of the symbol frequency of the output. In the GSM system, for instance, where the symbol frequency is 270.8333 kbps, preferred transfer frequencies include the multiples of a 13 MHz frequency and of these especially 26, 52, and 104 MHz, on which transfer frequencies the $2\pi$ phase circumference is divided into an integer part divisible by 4 (e.g., into 48 parts for the 13 MHz frequency because 13 MHz/48=270,8333 kHz) which is advantageous in the implementation of a QPSK-type (Quadrature Phase Shift Keying) constant amplitude modulation.

The phase modulation is implemented in synthesizer circuit 46 in accordance with the above-mentioned patent publications and FIG. 5. The method and circuit according to the invention can be used to achieve the advantage, for instance, that mixers 5, 6 and adders 7 shown in FIG. 1, or any compensation of phase shift or that of amplitude deviations are not needed to generate phase-modulated transmission signal $f_{TX}$.

The method described above also makes it easy to implement a transceiver operating on a frequency (output/reception frequency) higher than VCO frequencies $f_{LI}$, $f_{LQ}$ (41, 411, FIG. 4), or essentially on two different frequencies, of which the one is essentially a VCO frequency and the other one is essentially sum $f_{LI}+f_{LQ}$ of the VCO frequencies. This kind of hardware architecture is presented in FIG. 6 in such a way that the above-described receiver structures and method are included in block 50 (area marked by the dashed lines in FIG. 4). Synthesizer block 51 corresponds to unmodulated synthesizer 41 and block 56 corresponds to the modulating synthesizer that comprises blocks 46, 411, and 49 in FIG. 4, and blocks 52 and 521 correspond to multipliers 42 and 421 of the receiver, and multiplier 57 corresponds to mixer 47 of the transfer frequency, and filter 58 corresponds to filter 48 of the transfer frequency. The transceiver shown in FIG. 6 can be used (on a higher and a lower frequency range) in two mobile communications systems operating on different frequencies. The lower reception frequency is denoted as $f_{RX}$, the lower transmission frequency as $f_{TX}$, the higher reception frequency as $f_{RXU}$, and the higher transmission frequency as $F_{TXU}$.

Figure 6:
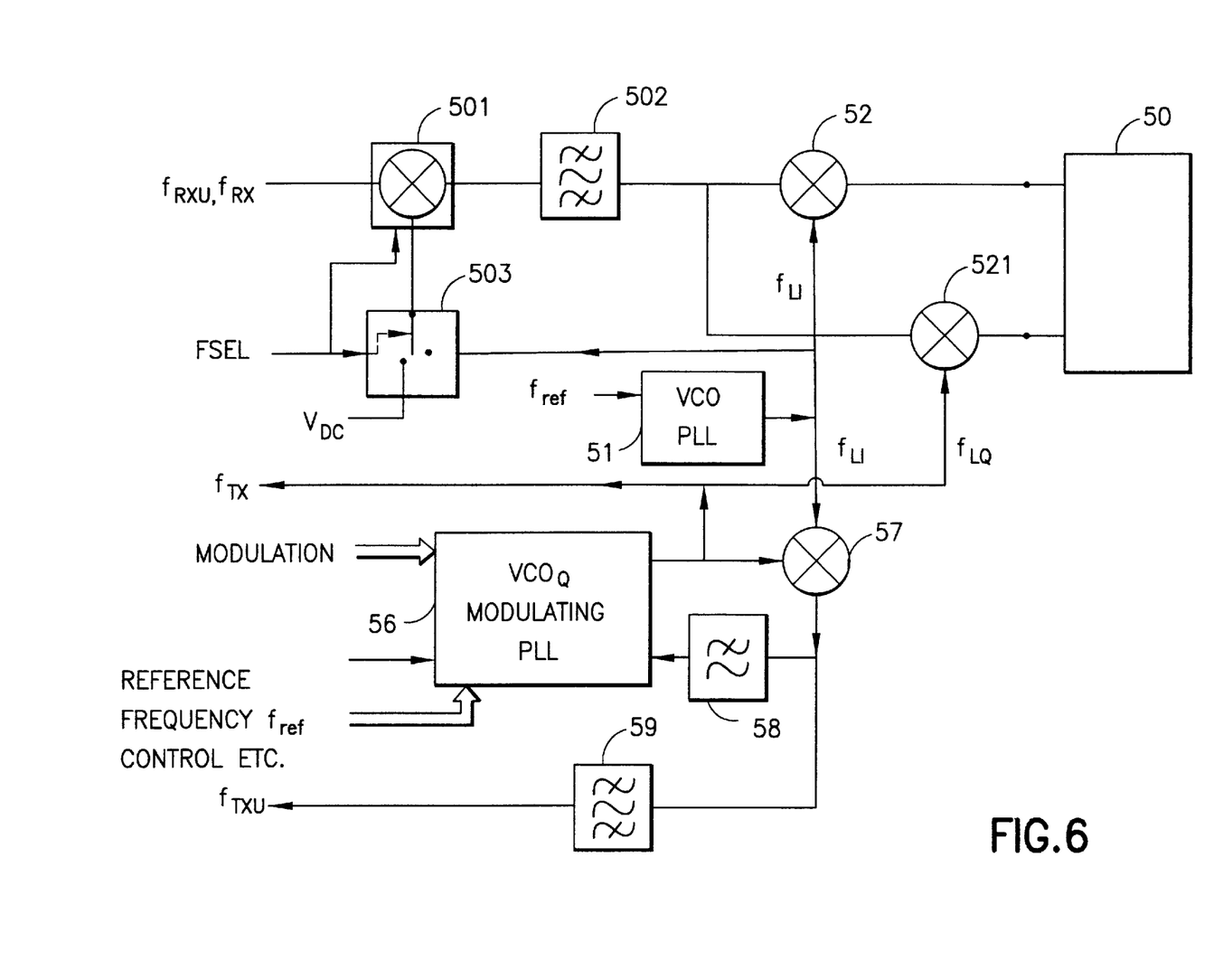
FIG. 6 presents the transceiver according to the invention in another operating mode.

In the reception facility synthesizers 51, 56 operate in a corresponding way to that in the case presented in FIG. 4. In order to receive the upper reception frequency $F_{RXU}$, local frequency $f_{LI}$ is taken to multiplier 501 as the second input signal, and the local-frequency mixing result is taken from the output of the multiplier to filter 502 (such as a bandpass filter) whose center frequency is approximately the same as the lower reception frequency $f_{RX}$ and, due to the manner of mixing, the following equation is valid in the upper reception frequency:

$$F_{RXU} \approx 2 \cdot f_{LI} \approx 2 f_{RX}. \quad (9)$$

When operating on the upper reception frequency $f_{RXU}$, element 503 (which can be a controllable switch, such as a transistor) selects, on the basis of selection signal FSEL of frequencies, frequency $f_{LI}$ as the second input signal of multiplier 501, and when operating on lower reception frequency $f_{RX}$, member 503 sets a zero-frequency component for the second input of multiplier 501, whereby multiplier 501 only functions as the amplifier of the lower-frequency signal $f_{RX}$. Control signal FSEL can also be used to control the operation of multiplier 501 so that the amplification, bandwidth, noise and power consumption of the transceiver correspond to the values required on the respective reception frequencies $f_{RX}$ and $F_{RXU}$.

Figure 7:
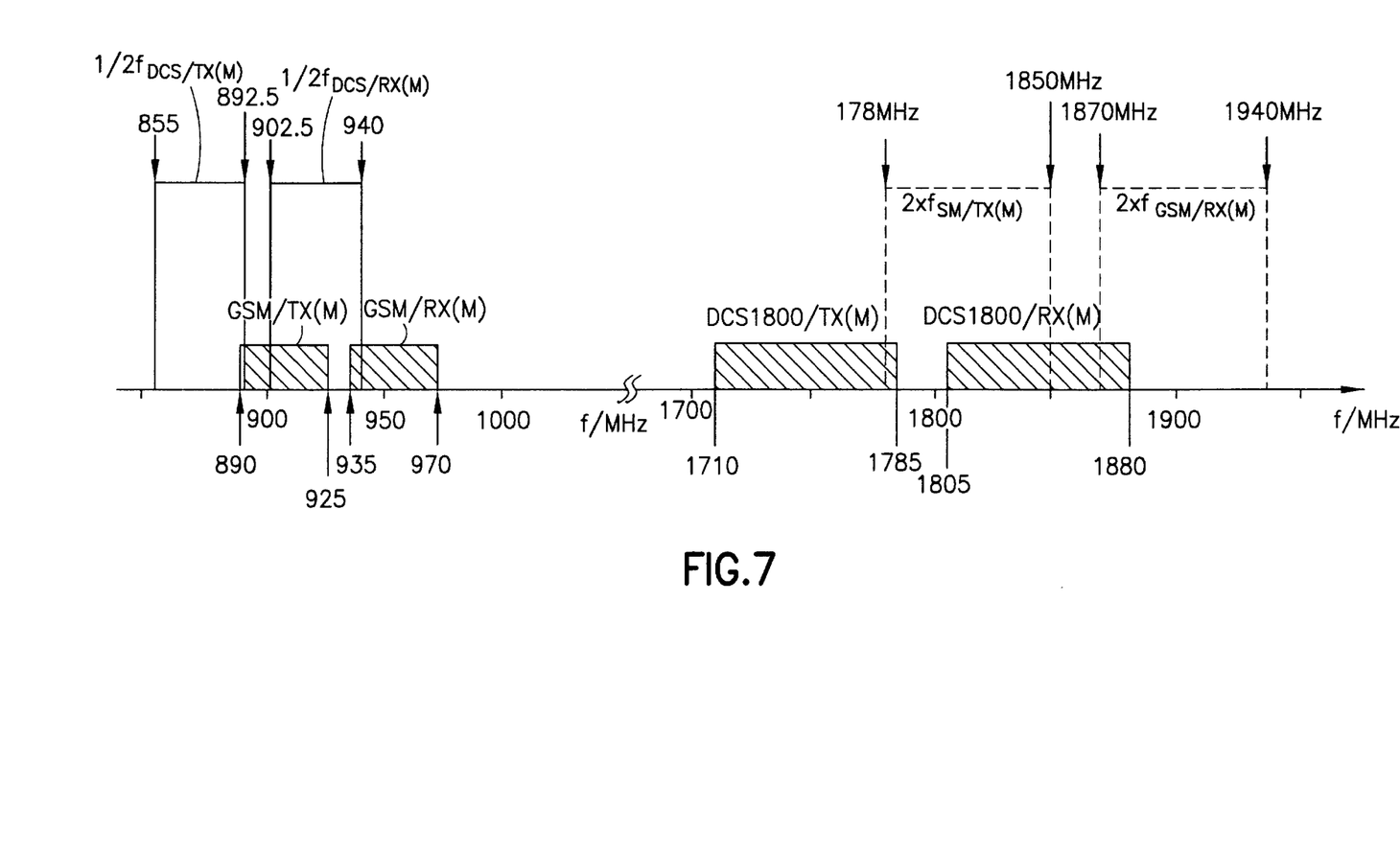
FIG. 7 presents an example of the transmission and reception frequency ranges of a mobile phone system operating in two different frequency ranges.

When considering frequencies of the GSM and the DCS 1800 systems (referred to as DCS in the figure) presented in FIG. 7, it can be observed that GSM-reception requires the operation of synthesizers 51, 56 on 935–970 MHz frequencies and, correspondingly, the DCS 1800 system requires operation on 902.5–940 MHz frequencies (half of the frequency), i.e., the combined frequency range required in the reception is 902.5–970 MHz for both synthesizers 51, 511 and for bandpass filter 502.

When transferring the operation onto upper transmission frequency $F_{TXU}$, sum $f_{LI}+f_{LQ}$ of the output frequencies of synthesizers 51 and 56 is selected as the transmission signal $F_{TXU}$ from the output signal of mixer 57 by using filter 59, and filter 58 is used to select, from the output signal of mixer 57, difference $f_{LQ}-f_{LI}$ of the frequencies of said synthesizers 51, 56 for modulation into desired transfer frequency $f_2$ to PLL synthesizer circuit 46 of frequency synthesizer 56, i.e., in the transmission state the frequencies adhere to the following group of equations:

$$|f_{LQ}-f_{LI}|=f_2$$

$$f_{LI}+f_{LQ}=f_{TXU} \quad (10)$$

When transmitting on lower transmission frequency $f_{TX}$, synthesizers 51, 56, mixer 57, and filter 58 of FIG. 6 operate in a corresponding way to that described above on the corresponding blocks in connection with FIG. 4. The frequencies in FIG. 7 require the transmission in the GSM-system to take place within the range of 890–925 MHz. If assumed that the offset frequency is $f_S=f_{LI}-f_{TX}=52$ MHz, the frequency range of synthesizer 51 in the GSM-system is 942–977 MHz or 838–873 MHz in the transmission state. When using a transfer frequency of 52 MHz, the following frequencies are obtained as frequencies of the synthesizers in the DCS-system in the transmission state:

$$f_{LI}(51): 829-866,5 \text{ MHz}$$

$$f_{LQ}(511): 881-918,5 \text{ MHz}$$

In this case transfer frequency $f_2=f_{LQ}-f_{LI}$ is always 52 MHz and $F_{TXU}=f_{LI}+f_{LQ}=1710$ MHz on the lower frequency edge, and on the higher limit $f_{LI}+f_{LQ}=1785$ MHz. Correspondingly, in the PCS-1900 system of the United States the reception frequency range of subscriber devices is 1930–1990 MHz and the transmission frequency range is 1850–1910 MHz. Furthermore, when using a 52 MHz transfer frequency, $f_{LI}=f_{LQ}=965-995$ Mhz are obtained as frequencies in the reception state, and in the transmission state:

$$f_{LI}(51): 899-929 \text{ MHz}$$

$$f_{LQ}(511): 951-981 \text{ MHz}$$

Figure 8:
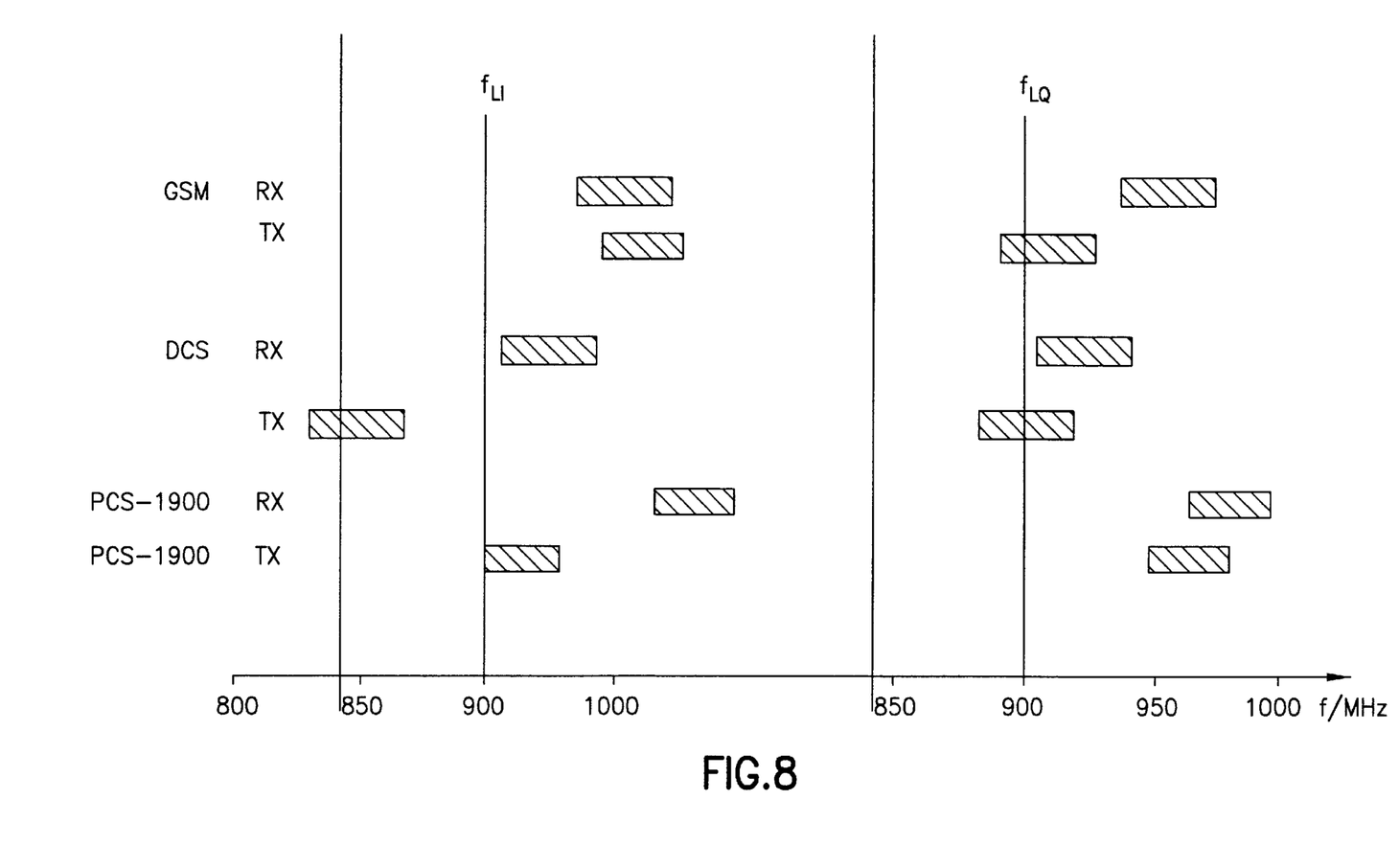
FIG. 8 presents the synthesizer frequencies used in the invention for different mobile communication systems.

When using higher frequencies, a 200 kHz channel space of the DCS 1800 and PCS 1900 systems is realized so that both $f_{LI}$ and $d_{LQ}$ are modified by 100 kHz in each channel space. The summary of the synthesizer frequencies mentioned above is presented in FIG. 8. As can be seen in the figure, the frequencies of all the systems mentioned as examples can be implemented by using one transceiver according to the invention, the frequency ranges of their synthesizers being:

$f_{LI}$(51):829–866,5 MHz,899–995 MHz $f_{LQ}$(511):881–995 MHz

The solution according to FIG. 6 is advantageous when implementing an I/Q-transceiver device operating on high frequencies because in order to implement reception, only the first mixer 501 of the receiver and, in order to implement the transmission to generate modulated transmission signal $F_{TXU}$, the transfer frequency mixer 57 and filter 59 must be capable of operating on high frequencies. This is a great advantage for devices operating on 2 GHz frequency ranges, as well as the fact that, provided with only minor additions, the device is capable of operating on two different frequency ranges, the higher of which is preferably approximately twofold compared to the lower one. Furthermore, this device also comprises the same advantages related to manufacturing as the device in FIG. 4.

Particularly suitable usage applications for the method and device disclosed above are radio sets according to the GSM-standard that operate on a 900 MHz frequency, radio sets according to the DCS 1800 standard that operate on a 1.8 GHz frequency, or radio sets operating in both systems, as well as the advantageous combination of 900 MHz GSM mobile stations and cordless DECT mobile stations operating on 1880–1900 MHz frequencies in one radio set. Using the invention, it is possible to implement radio sets that operate on different frequencies and use different modulations. Furthermore, the method and transceiver according to the invention avoid the handling of frequencies which are twice the reception frequency when forming the phase difference of the I- and Q-signals in reception, so the desired 90° phase difference is obtained accurately.

I claim:

1. A transceiver comprising a transmission part for generating a complex I/Q-signal on a transmission frequency ($F_{TX}$, $f_{TXU}$) and a reception part for receiving a received signal on a reception frequency ($f_{RX}$, $f_{RXU}$), the reception part comprising:
   a first branch for processing an I-component of the received signal,
   a second branch for processing a Q-component of the received signal,
   the first branch comprises a first mixer (42; 52) for mixing the I-component of the received signal into a lower-frequency I-signal, and
   the second branch comprises a second mixer (421; 521) for mixing the Q-component of the received signal into a lower-frequency Q-signal, characterized in that said transceiver further comprises
   a first frequency synthesizer (41; 51) for forming a first mixer signal ($f_{LI}$) for the first mixer (42; 52) of the first branch for mixing said I-component into said I-signal, and
   a second frequency synthesizer (411, 49; 46, 56) for forming a second mixer signal ($f_{LQ}$) for the second mixer (421, 521) of the second branch for mixing said Q-component into said Q-signal, and
   control means (45) for controlling said first ($f_{LI}$) and second ($f_{LQ}$) mixer signals to have the same phase with respect to their mixing effects and, thereafter, to have a 90 degree mutual phase shift in their mixing effects when receiving signals, in order to bring said lower-frequency I- and Q-signals into a 90 degree mutual phase shift.

2. A transceiver according to claim 1, characterized in that said transceiver comprises in the transmission part:
   a third mixer (47; 57) for mixing the first ($f_{LI}$) and the second ($f_{LQ}$) mixer signals into a higher-frequency transmission signal ($f_{TXU}$),
   a first output for providing said higher-frequency transmission signal ($f_{TXU}$) as an output signal, and
   a second output for providing the second mixer signal ($f_{LQ}$) as a lower-frequency transmission signal ($f_{TX}$).

3. A transceiver according to claim 2, characterized in that said second frequency synthesizer comprises a cascade-connected, voltage-controlled oscillator (VCO) (411), and a phase-locked synthesizer circuit (46) controlling (the same) said VCO, said VCO forming a frequency and phase modulation of the second mixer signal ($f_{LQ}$) in accordance with a received control signal (461, 462), and said transceiver further comprises means (48; 58) in the transmission part for selecting a difference frequency ($f_2$, $f_S$) of the first ($f_{LI}$) and the second ($f_{LQ}$) mixer signals from the output of said third mixer (47; 57), and for providing said difference frequency ($f_2$, $f_S$) as said control signal (462) to said phase-locked synthesizer circuit (46).

4. A transceiver according to claim 1, characterized in that said transceiver further comprises, in the reception part, before said first mixer (42;52) of the first branch and said second mixer (421; 521) of the second branch,
   a further mixer (501) for mixing a higher-frequency reception signal ($f_{RXU}$) into a lower reception frequency ($f_{RX}$) using the first mixer signal ($f_{LI}$) while the reception part operates on the higher reception frequency ($f_{RXU}$), and using a zero-frequency signal (VDC) as the mixing signal of said further mixer (501) while the reception part operates on the lower reception frequency ($f_{RX}$).

5. A transceiver according to claim 1, characterized in that the control means (45) controls said second frequency synthesizer (411, 49, 46; 56) to direct the phase of said second mixer signal ($f_{LQ}$) into a 90 degree phase shift in its mixing effect, with respect to said first mixer signal ($f_{LI}$), when receiving signals so as to bring said lower-frequency I- and Q-signals into a 90 degree mutual phase shift.

6. A method for modulating and mixing a complex I/Q-signal into a transmission frequency ($f_{TX}$, $F_{TXU}$) and a reception frequency ($f_{RX}$, $f_{RXU}$) in which
   an I-signal is processed in a first branch,
   a Q-signal is processed in a second branch,
   an i-component of a signal received in the first branch is mixed into a lower-frequency I-signal, and
   a Q-component of a signal received in the second branch is mixed into a lower-frequency Q-signal, characterized in that the following steps are carried out during reception:
   forming a first mixer signal ($f_{LI}$) which is used to mix the I-component of the received signal into a lower-frequency I-signal,
   forming a second mixer signal ($f_{LQ}$) which is used to mix the Q-component of the received signal into a lower-frequency Q-signal,
   initially controlling the first ($f_{LI}$) and the second ($f_{LQ}$) mixer signals to have a same phase in their mixing effects, whereby said lower-frequency I-signal and said lower-frequency Q-signal are in the same phase, and
   subsequently controlling said mixer signals ($f_{LI}$, $f_{LQ}$) to have a 90 degree mutual phase shift such that said lower-frequency I-signal and said lower-frequency Q-signal are in a 90 degree phase shift with respect to one another.

7. A method according to claim 6, characterized in that a phase of the second mixer signal ($f_{LQ}$) is modified by 90 degrees with respect to the first mixer signal ($f_{LI}$).

8. A method according to claim 6, characterized in that the following steps are carried out during transmission for forming two different transmission frequencies:

mixing said first ($f_{LI}$) and second ($f_{LQ}$) mixer signals for forming a sum signal thereof and providing the sum signal as an output when operating on a first, higher transmission frequency ($f_{TXU}$), and providing only one of the mixer signals ($f_{LI}$ or $f_{LQ}$) as an output when operating on a second, lower transmission frequency ($f_{TX}$).

9. A method according to claim 8, characterized in that the following steps are further carried out during transmission for modulating the transmission frequency ($f_{TX}$, $f_{TXU}$):

selecting a difference frequency ($f_2$, $f_S$) of said first ($f_{LI}$) and second ($f_{LQ}$) mixer signals from the mixing result thereof, and using said difference frequency ($f_2$, $f_S$) to control a frequency and phase modulation of said second mixer signal ($f_{LQ}$).

10. A method according to claim 6, characterized in that the following steps are further carried out during reception for receiving two different reception frequencies before mixing the I- and Q-components of the received signal into lower-frequency I- and Q-signals:

mixing a higher-frequency reception signal ($f_{RXU}$), by using the first mixer signal ($f_{LI}$), into a lower reception frequency ($f_{RX}$) while operating on the higher reception frequency ($f_{RXU}$), and mixing the reception signal using a zero-frequency signal (VDC) while operating on the lower reception frequency ($f_{RX}$).

11. A transceiver for a radiotelephone operating with a digital radio frequency phase modulation protocol, comprising:

a receiver for receiving a complex I/Q received signal on a reception frequency in one of a first reception frequency band or a second reception frequency band;

a transmitter for generating a complex I/Q signal on a transmission frequency in one of a first transmission frequency band or a second transmission frequency band;

said receiver comprising a first branch for processing an I-component of the received signal and a second branch for processing a Q-component of the received signal, said first branch comprising a first mixer for mixing the I-component of the received signal into a lower-frequency I-signal, said second branch comprising a second mixer for mixing the Q-component of the received signal into a lower-frequency Q-signal;

a first frequency synthesizer for generating a first mixer signal for said first mixer for mixing said I-component into said I-signal;

a second frequency synthesizer for generating a second mixer signal for said second mixer for mixing said Q-component into said Q-signal;

control means for controlling said first and second mixer signals to first have a same phase with respect to their mixing effects and, thereafter, to have a 90 degree mutual phase shift with respect to their mixing effects in order to bring said I-signal and said Q-signal into a 90 degree mutual phase shift; and said transmitter further comprising a third mixer for mixing said first and said second mixer signals into a higher frequency transmission signal, a first output for providing said higher frequency transmission signal as an output signal, and a second output for providing the second mixer signal as a lower frequency transmission signal.

12. A transceiver as in claim 11, wherein said receiver further comprises, at an input to said first branch and said second branch, a fourth mixer for mixing a higher frequency reception signal into a lower reception frequency by using the first mixer signal while said receiver operates on the higher reception frequency, and by using a zero-frequency signal as the mixing signal while said receiver operates on the lower reception frequency.

13. A transceiver as in claim 11, wherein said first reception frequency band is comprised of a band of frequencies having a value that is approximately one half of the value of a band of frequencies that comprise said second reception frequency band, and wherein said first transmission frequency band is comprised of a band of frequencies having a value that is approximately one half of the value of a band of frequencies that comprise said second transmission frequency band.

14. A transceiver as in claim 11, wherein said first reception and transmission frequency bands are comprised of frequencies having a value of about 900 MHz, and wherein said second reception and transmission frequency bands are comprised of frequencies having a value of about 1800 MHz.

15. A transceiver as in claim 11, wherein said first reception and transmission frequency bands are comprised of frequencies having a value of about 900 MHz, and wherein said second reception and transmission frequency bands are comprised of frequencies having a value of about 1900 MHz.

* * * * *